Figure 1:
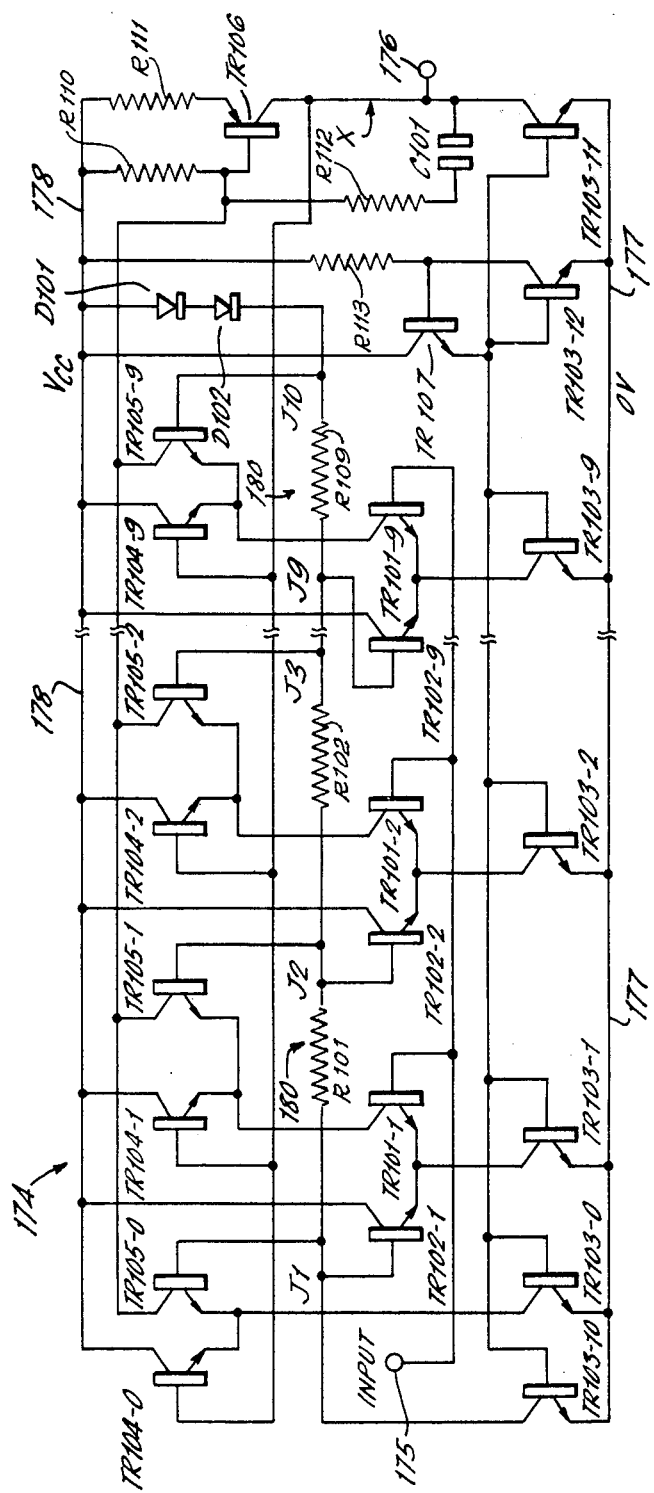

United States Patent [19]

Metcalf et al.

[11] 4,032,797
[45] June 28, 1977

[54] QUANTISING CIRCUIT

[75] Inventors: Eric Metcalf, Ropley; Paul Nicholas Loewenstein, Camberley, both of England

[73] Assignee: The Solartron Electronic Group Limited, Farnborough, England

[22] Filed: Aug. 6, 1975

[21] Appl. No.: 602,482

[52] U.S. Cl. .................................. 307/227; 307/230; 307/361; 307/360; 328/14; 328/142; 328/186; 340/347 AD

[51] Int. Cl.² .................... H03K 4/02; G06G 7/12; H03B 19/00

[58] Field of Search ............... 307/230, 227, 235 P, 307/235 N, 229; 328/14, 142, 186; 340/347 AD

[56] References Cited

UNITED STATES PATENTS

| | | | |
|---|---|---|---|
| 2,869,079 | 1/1959 | Staffin et al. | 332/11 |
| 3,458,721 | 7/1969 | Maynard | 307/235 P |
| 3,539,831 | 11/1970 | Gilbert | 307/235 P |
| 3,585,631 | 6/1971 | McCown | 340/347 AD |
| 3,789,389 | 1/1974 | Lenhoff, Jr. | 340/347 AD |

Primary Examiner—Stanley D. Miller, Jr.
Attorney, Agent, or Firm—W. R. Sherman; K. McMahon; M. Novack

[57] ABSTRACT

The analogue storage circuit comprises a nonlinear amplifier for amplifying an input voltage. The amplifier includes means for generating a sequence of predetermined voltages, each predetermined voltage being higher than the preceding one in the sequence. A plurality of voltage level responsive circuits are each connected to receive the input signal and a respective one of said predetermined voltages and are each arranged to change from a first state to a second state as the input voltage passes through a level of equality with the respective predetermined voltage in a given direction. An output circuit is provided, as well as a plurality of voltage follower circuits each having a first input connected to receive a respective one of the predetermined voltages and an output connected to the input of the output circuit. Each voltage follower circuit is arranged to be rendered operative by a respective one of the voltage level responsive circuits when the input voltage lies between the respective predetermined voltage received by that voltage level responsive circuit and the next successive predetermined voltage in the given direction. And each voltage follower circuit is arranged, when operative, to co-operate with the output circuit to maintain the output voltage substantially equal to the respective voltage at the first input of the voltage follower circuit.

14 Claims, 2 Drawing Figures

QUANTISING CIRCUIT

This invention relates to non-linear amplifying circuits, and is particularly, but not exclusively, concerned with such non-linear amplifying circuits for use in analogue storage circuits and systems as described in co-pending U.S. patent application Ser. No. 602,161 in the names of A. J. Ley, E. Metcalf, E. A. Martin and P. N. Loewenstein, and filed on the same day as the present application.

As explained in detail in the aforementioned co-pending United States patent application, the analogue storage circuit described therein employs a so-called "quantising circuit" to prevent degradation of the stored analogue signals. This quantising circuit can be based on the combination of an analogue-to-digital converter and a digital-to-analogue converter connected in series, but it is preferable to base it on a non-linear amplifier capable of being implemented as an integrated circuit in which a charge-coupled device, forming the basic storage element of the analogue storage circuit, is also contained.

It is therefore an object of the present invention to provide a non-linear amplifying circuit suitable for use in a quantising circuit forming part of an analogue storage circuit.

It is a further object of the present invention to provide such a non-linear amplifying circuit which is suitable for implementation, together with the greater part of the remainder of the analogue storage circuit, as a large scale integrated circuit.

According to the present invention, a non-linear amplifying circuit comprises:

means for generating a sequence of predetermined voltages, each predetermined voltage being higher than the preceding one in the sequence;

a plurality of voltage level responsive circuits each connected to receive the input signal and a respective one of said predetermined voltages and each arranged to change from a first state to a second state as the input voltage passes through a level of equality with the respective predetermined voltage in a given direction;

an output circuit for producing an output voltage; and a plurality of voltage follower circuits each having a first input connected to receive a respective one of said predetermined voltages and an output connected to the input of the output circuit, each voltage follower circuit being arranged to be rendered operative by a respective one of said voltage level responsive circuits when the input voltage lies between the respective predetermined voltage received by that voltage level responsive circuit and the next successive predetermined voltage in said given direction, and each voltage follower circuit being arranged, when operative, to co-operate with the output circuit to maintain the output voltage substantially equal to the respective voltage at the first input of the voltage follower circuit.

Figure 2:
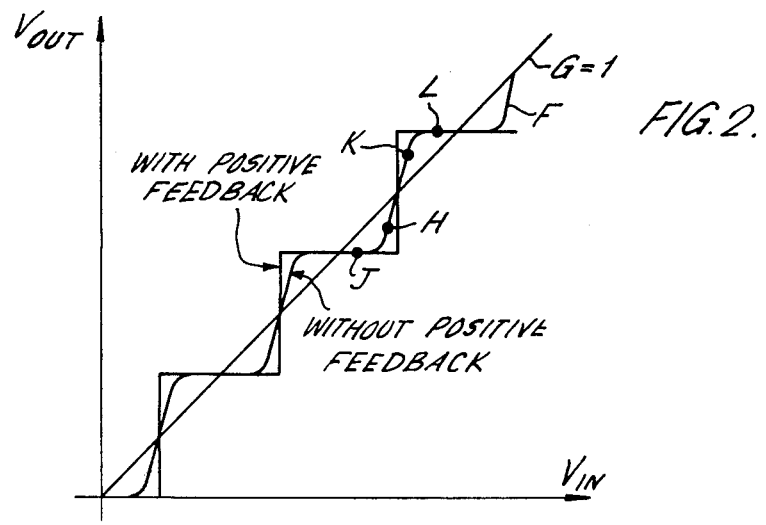

An embodiment of the invention will now be described, by way of non-limitative example only, with reference to the accompanying drawings, of which:

FIG. 1 is a circuit diagram of a non-linear amplifying circuit in accordance with the present invention, for use in a quantising circuit forming part of an analogue storage circuit as described in aforementioned co-pending U.S. patent application; and FIG. 2 is an explanatory diagram illustrating an operating characteristic of the circuit of FIG. 1.

The non-linear amplifying circuit of FIG. 1 is indicated generally at 174, and has an input 175 and an output 176.

The input 175 is connected to the respective bases of nine transistors TR101-1 to TR101-9, of which only three are shown in FIG. 7 for the sake of clarity. Each of the transistors TR101-1 to TR101-9 forms one transistor of a respective emitter-coupled pair of transistors, the other transistors of these emitter-coupled pairs being indicated at TR102-1 to TR102-9 respectively. The commoned emitters of each of the emitter-coupled pairs TR101-1, TR101-2 to TR101-9, TR102-9 are connected, via respective transistors TR103-1 to TR103-9 each arranged to operate as a constant current source, to a zero volt power supply rail 177, while the respective collectors of the transistors TR102-1 to TR102-9 are all connected to a positive power supply rail 178.

The respective bases of the transistors TR102-1 to TR102-9 are connected to respective junctions J1 to J9 of a resistive potential divider chain 180, which comprises nine substantially equal resistors R101 to R109. The resistor R109 is connected to the rail 178 via two forward-biassed diodes D101, D102, while the resistor R101 is connected to the rail 177 via a transistor TR103-10 arranged to operate as a constant current source. The junctions J1 to J9 are respectively situated at the ends of the resistors R101 to R109 nearer to the transistor TR103-10 and the rail 177, i.e. at the lower-voltage end of the respect resistor, and a further junction J10 is provided between the resistor R109 and the diodes D101, D102, i.e. at the higher-voltage end of the resistor R109. The values of the resistors R101-R109 and the total voltage drop thereacross are chosen to be such that the voltage drop across each resistor is just greater than the saturation voltage of any of the transistors TR101.

The respective collectors of the transistors TR101-1 to TR101-9 are each connected to the commoned emitters of a respective one of nine further emitter-coupled pairs of transistors TR104-1, TR105-1 to TR104-9, TR105-9. The respective collectors of the transistors TR104-1 to TR104-9 are connected to the rail 178, while the respective bases thereof are connected to the collector of a PNP transistor TR106. The respective bases of the transistors TR105-1 to TR105-9 are respectively connected to the junctions J2 to J10 of the potential divider chain 180, while the respective collectors thereof are connected on the one hand to the base of the transistor TR106, and on the other hand to the rail 178 via a common resistor R110.

A further emitter-coupled pair of transistors TR104-0, TR105-0 is provided, the collector of the transistor TR104-0 being connected to the rail 178 and the base thereof being connected to the collector of the transistor TR106. The commoned emitters of the transistors TR104-0 and TR105-0 are connected via yet another constant current source transistor TR103-0 to the rail 177. The base of the transistor TR105-0 is connected to the junction J1 of the potential divider chain 180, while the collector thereof is commoned with the collectors of the transistors TR105-1 to TR105-9.

The transistor TR106, which operates as a simple grounded-emitter type amplifier, has its emitter connected to the rail 178 via a resistor R111. The collector of the transistor TR106 constitutes the output 176, and is connected via another constant current source transistor TR103-11 to the rail 177. The series combination of a resistor R112 and a capacitor C101 is connected between the base and the collector of the transistor TR106 to eliminate the possibility of high frequency oscillation.

The respective bases of the constant current source transistors TR103-0 to TR103-11 are commoned and connected to the emitter of an emitter-follower transistor TR107, whose collector is connected to the rail 178 and whose base is connected to the rail 178 via a resistor R113. The base of the transistor TR107 is also connected via a yet further constant current transistor TR103-12, to the rail 177, the base of the transistor TR103-12 being commoned with the bases of all the other constant current source transistors TR103.

All the transistors are NPN transistors except the transistor TR106. The amplifier 174 is again eminently suitable for implementation as an integrated circuit, in which case the capacitor C101 and resistor R112 may be unnecessary.

The operation of the quantising amplifier 174 will now be described. With the input voltage $V_{in}$ applied to the input 175 at its normal minimum value (about one volt), all the transistors TR101-1 to TR101-9 are non-conductive, while all the transistors TR102-1 to TR102-9 are conductive. Thus all the emitter-coupled pairs TR104-1, TR105-1 to TR104-9, TR105-9 are inoperative. However, the biasing of the transistor TR106, and in particular the value of the resistor R110, is arranged to be such that the resistor R110 draws a current equal to half the current drawn through the transistor TR106 by its constant current drawn through the transistor TR106 by its constant current source transistor TR103-11, so that the emitter-coupled pair TR104-0, TR105-0 is operative. The transistors TR104-0, TR105-0, which together constitue a differential amplifier, co-operate with the transistor TR106 to form a closed negative-feedback loop, which operates to maintain the output voltage at the collector of the transistor TR106, i.e. at the output 176, equal to the voltage at the base of the transistor TR105-0, i.e. equal to the voltage at the junction J1 of the potential divider chain 180.

As the input voltage $V_{in}$ increases, the output voltage does not change significantly until $V_{in}$ begins to exceed the voltage at the junction J1 of the potential divider chain 180, causing the transistor TR101-1 to become conductive. The emitter-coupled pair TR104-1, TR105-1 is rendered operative by the transistor TR101-1, and the increased current drawn through the resistor R110 by the transistor TR105-1 increases the output voltage at the output 176. This increased output voltage renders the transistor TR104-0 fully conductive and the transistor TR105-0 non-conductive, so that the differential amplifier constituted by these two transistors is effectively rendered inoperative. It is the differential amplifier constituted by the transistors TR104-1 and TR105-1 which then forms a closed negative-feedback loop with the transistor TR106. However, this new loop operates to maintain the output voltage at the output 106 equal to the voltage at the base of the transistor TR105-1, i.e. equal to the voltage at the junction J2 of the potential divider chain 180.

The transistion of the amplifier 174 from the state where the output voltage is determined by the voltage at the junction J1 to the state where the output voltage is determined by the voltage at the junction J2 takes place over a relatively small range of the value of the input voltage $V_{in}$. Thereafter, the output voltage again does not change significantly as the input voltage $V_{in}$ increases, until $V_{in}$ begins to exceed the voltage at the junction J2 of the potential divider chain 180. Then, in a manner exactly analogous to that described in the preceding paragraph, the differential amplifier constituted by the emitter-coupled pair TR104-2, TR105-2 is rendered operative, the transistors TR104-1 and TR105-1 become fully conductive and non-conductive respectively, rendering the differential amplifier constituted thereby effectively inoperative, and the output voltage increases to, and is maintained at, the voltage at the junction J3 of the potential divider chain 180. As the input voltage $V_{in}$ increases still further, the emitter-coupled pairs TR104-3, TR105-3 to TR104-9, TR105-9 are successively rendered operative and the output voltage is successively determined by the respective voltages at the juntions J4-J10 of the potential divider chain 180. The amplifier 174 thus has an input voltage output voltage characteristic of approximately staircase form, as shown at F in FIG. 2. The mean gain is inherently equal to unity for the amplifier 174, since the potential divider 180 determines both the values of the input voltage $V_{in}$ at which transitions occur, and the values of the output voltage $V_{out}$ which result from these transitions.

It will be appreciated that there is a small offset between the output voltage $V_{out}$ and the input voltage $V_{in}$. In order to apply positive feedback between the output 176 and the input 175, as is described in relation to the amplifier 74 of FIG. 4 of the aforementioned co-pending U.S. patent application, it is necessary to eliminate this offset. One simple way of doing this is the insert a relatively low value resistor between the respective collectors of the transistors TR106 and TR103-11, in the position indicated at X in FIG. 1, and to use the collector of the transistor TR103-11 as the output 176. Then, with direct positive feedback applied by means of an FET switch as described in relation to the amplifier 74 of FIG. 4 of the aforementioned co-pending United States patent application, the output voltage $V_{out}$ will take only ten possible discrete values exactly as described in relation to FIG. 5 of the aforementioned co-pending United States patet application.

It will be appreciated that it is a simple matter to modify the amplifier 174, by increasing or decreasing the number of stages such as TR101-1, TR102-1, TR103-1, TR104-1, TR105-1, R101, to produce an output voltage having more or less than ten possible discrete values.

The quantising amplifier 174 can be modified in several different ways. For example, the emitter-coupled pairs TR104, TR105 can be connected in the collectors of the transistor TR102 so as to be successively de-energised as the input voltage increases, in which case their respective collector connections are interchanged. Alternatively, the respective differential amplifiers constituted by the emitter-coupled pairs TR104, TR105 can be replaced by respective voltage follower circuits of a more simple kind, e.g. emitter followers, coupled to a common output circuit which reproduces (or responds to) the highest or lowest input voltage applied thereto.

We claim:

1. A quantising circuit for quantising an input voltage, comprising:
   means for generating a set of predetermined voltages, each predetermined voltage being higher than the preceding one in the set;

a plurality of voltage level responsive circuits each connected to receive the input signal and a respective one of said predetermined voltages and each being operative to change from a first state to a second state as the input voltage passes through a level of equality with the respective predetermined voltage in a given direction;

an output circuit for producing an output voltage; and a plurality of amplifier circuits each having a first input connected to receive a respective one of said predetermined voltages, a second input connected to receive said output voltage in a negative feedback sense, and an output coupled to the input of the output circuit, each amplifier circuit being rendered operative by a respective one of said voltage level responsive circuits when the input voltage lies between the respective predetermined voltage received by that voltage level responsive circuit and the next successive predetermined voltage in said given direction, and each amplifier circuit, when operative, constituting a voltage follower circuit which maintains the output voltage substantially equal to the respective voltage at the first input of the amplifier circuit, whereby the output circuit produces an output voltage which can take only a respective one of a plurality of substantially discrete levels in dependence on the magnitude of the input voltage.

2. A circuit as claimed in claim 1, wherein the means for generating said set of predetermined voltages comprises a potential divider chain connected to receive and divide a substantially fixed voltage.

3. A circuit as claimed in claim 1, further comprising a positive feedback circuit for coupling the output of the circuit to the input thereof, whereby to more precisely define said discrete values.

4. A circuit as claimed in claim 1, wherein each amplifier circuit is respectively connected to receive the (R + N)th predetermined voltage of the set, where R is the position in the set of the respective predetermined voltage received by the voltage level responsive circuit associated with that amplifier circuit and N is a positive integer.

5. A circuit as claimed in claim 4, wherein N=1.

6. A circuit as claimed in claim 4, wherein the output circuit comprises an output amplifier, and wherein each amplifier circuit comprises a differential amplifier.

7. A circuit as claimed in claim 4, wherein each voltage level responsive circuit comprises a respective emitter-coupled pair of transistors, the base of one transistor of the pair being arranged to receive the input voltage and the base of the other transistor of the pair being connected to receive the respective predetermined voltage.

8. A circuit as claimed in claim 7, wherein each differential amplifier is connected in series with said one transistor of its associated voltage level responsive circuit to be energised by said one transistor when said one transistor is rendered conductive.

9. A circuit as claimed in claim 8, wherein each differential amplifier comprises a respective further emitter-coupled pair of transistors, whose commoned emitters are connected to the collector of said one transistor of the associated voltage level responsive circuit, the base of one transistor of the pair constituting the first input of the differential amplifier and the base of the other transistor constituting the second input of the differential amplifier.

10. A circuit as claimed in claim 9, further comprising an additional differential amplifier which comprises in turn another emitter-coupled pair of transistors, the base of the one transistor of the pair being connected to receive the first predetermined voltage of the set and the base of the other transistor of the pair being connected to receive the output voltage, the collector of said one transistor being commoned with the respective collectors of each of said one transistor of all the further emitter-coupled pairs.

11. A circuit as claimed in claim 8, wherein the respective collectors of each said one transistor of all the further emitter-coupled pairs are commoned and connected to a common collector load resistor and to the input of the output amplifier.

12. A circuit as claimed in claim 11, wherein all the transistors of all the emitter-coupled pairs are of one conductivity type, and the output amplifier comprises a single transistor of the other conductivity type arranged in a grounded-emitter type configuration.

13. A circuit as claimed in claim 2, wherein the potential divider chain comprises a plurality of substantially equal value resistances.

14. In a quantising circuit for quantising an input voltage, said quantising circuit including means for generating a set of predetermined voltages, each predetermined voltage being higher than the preceding one in the set, a plurality of voltage level responsive circuits each connected to receive the input signal and a respective one of said predetermined voltages and each being operative to change from a first state to a second state as the input voltage passes through a level of equality with the respective predetermined voltage in a given direction, and an output circuit responsive to said voltage level responsive circuits for producing an output voltage which can take only a respective one of a plurality of substantially discrete levels in dependence on the magnitude of the input voltage; the improvement comprising:

a plurality of amplifier circuits each having a first input connected to receive a respective one of said predetermined voltages, a second input connected to receive said output voltage in a negative feedback sense, and an output coupled to the input of the output circuit, each amplifier circuit being rendered operative by a respective one of said voltage level responsive circuits when the input voltage lies between the respective predetermined voltage received by that voltage level responsive circuit and the next successive predetermined voltage in said given direction, and each amplifier circuit, when operative, constituting a voltage follower circuit which maintains the output voltage substantially equal to the respective voltage at the first input of the amplifier circuit.

* * * * *

UNITED STATES PATENT OFFICE
CERTIFICATE OF CORRECTION

Patent No. 4,032,797      Dated June 28, 1977

Inventor(s) Eric Metcalf and Paul Nicholas Loewenstein

It is certified that error appears in the above-identified patent and that said Letters Patent are hereby corrected as shown below:

IN THE SPECIFICATION:

Column 3, line 17 "suitablefor" should read --suitable for--.
line 31, after "current" delete "drawn through the transistor TR106 by its constant current".

Column 4, line 19 delete "voltageoutput" and substitute therefor -- voltage/output -- line 32, after "is" delete "the" and substitute therefor -- to --.

Signed and Sealed this

Second Day of May 1978

[SEAL]

Attest:

RUTH C. MASON
Attesting Officer

LUTRELLE F. PARKER
Acting Commissioner of Patents and Trademarks